(12) United States Patent
Xu et al.

(10) Patent No.: US 11,164,999 B2
(45) Date of Patent: Nov. 2, 2021

(54) WHITE LIGHT EMITTING DEVICE AND DIFFUSING LAYER

(71) Applicant: Bridgelux, Inc., Fremont, CA (US)

(72) Inventors: Tao Xu, Fremont, CA (US); Aaron Merrill, Fremont, CA (US); Yi-Qun Li, Danville, CA (US)

(73) Assignee: Bridgelux, Inc., Fremont, CA (US)

( * ) Notice: Subject to any disclaimer, the term of this patent is extended or adjusted under 35 U.S.C. 154(b) by 0 days.

(21) Appl. No.: 16/293,176

(22) Filed: Mar. 5, 2019

(65) Prior Publication Data
US 2020/0287101 A1    Sep. 10, 2020

(51) Int. Cl.
| | |
|---|---|
| *H01L 33/00* | (2010.01) |
| *H01L 33/50* | (2010.01) |
| *H01L 25/075* | (2006.01) |
| *H01L 33/58* | (2010.01) |

(52) U.S. Cl.
CPC ........ *H01L 33/504* (2013.01); *H01L 25/0753* (2013.01); *H01L 33/58* (2013.01)

(58) Field of Classification Search
CPC .......................... H01L 25/0753; H01L 33/504
See application file for complete search history.

(56) References Cited

U.S. PATENT DOCUMENTS

| | | | |
|---|---|---|---|
| 2012/0153311 A1* | 6/2012 | Yuan ......................... | F21K 9/90 257/88 |
| 2013/0093362 A1* | 4/2013 | Edwards .................. | F21K 9/232 315/313 |
| 2013/0141013 A1 | 6/2013 | Kodama et al. | |
| 2014/0218940 A1* | 8/2014 | Dai ........................ | F21V 13/08 362/355 |
| 2017/0261164 A1* | 9/2017 | Ogata ..................... | H05B 45/10 |

FOREIGN PATENT DOCUMENTS

| | | |
|---|---|---|
| DE | 102016107089 A1 | 10/2016 |
| EP | 2760047 A3 | 1/2015 |
| JP | 2010034184 A | 2/2010 |
| WO | 2012121304 A1 | 9/2012 |

OTHER PUBLICATIONS

International Search Report, PCT/US2020/020755.
Written Opinion of the International Search Authority, PCT/US2020/020755.

* cited by examiner

*Primary Examiner* — Samuel A Gebremariam
(74) *Attorney, Agent, or Firm* — CrossPond Law

(57) ABSTRACT

There is provided a white light emitting device comprising a first LED and a second LED disposed on a substrate, a first photoluminescence material layer disposed over at least said first LED, a second photoluminescence material layer disposed over at least said second LED, and a diffusing layer disposed over said first and second photoluminescence layers, said diffusing layer comprising light scattering particles. A method and component are also provided.

23 Claims, 7 Drawing Sheets

SECTION A-A

WHITE LIGHT EMITTING DEVICE AND DIFFUSING LAYER

FIELD OF THE INVENTION

Embodiments of the present invention are directed to white light emitting devices; in particular, although not exclusively, to color tunable white light emitting devices. More particularly, although not exclusively, embodiments concern white light emitting devices comprising a diffusing layer.

BACKGROUND OF THE INVENTION

White light emitting LEDs ("white LEDs") include one or more photoluminescence materials (typically inorganic phosphor materials), which absorb a portion of the excitation light (typically blue) emitted by the LED and re-emit light of a different color (wavelength). The portion of the blue light generated by the LED that is not absorbed by the photoluminescence material combined with the light emitted by the photoluminescence material provides light which appears to the eye as being white in color. Due to their long operating life expectancy (>50,000 hours) and high luminous efficacy (100 lumens per watt and higher), white LEDs are rapidly replacing conventional fluorescent, compact fluorescent and incandescent lamps.

A color tunable white light emitting device typically comprises multiple LEDs. There are various forms of color tunable LEDs. One form is Chip Scale Packaging (CSP) in which each LED Chip (Die) is individually coated with the photoluminescence material. Typically, multiple CSP LEDs are then packaged to form the color tunable white light emitting device. While this form of LED generates white light having good color uniformity, it is relatively expensive to manufacture since each LED Chip requires an individual uniform thickness coating of photoluminescence material. Since the manufacturing process takes more time due to the intricacies involved in individually coating each LED Chip, this process is expensive. Moreover, CSP can require the use of more photoluminescence material, thereby further increasing costs. The luminous efficacy of CSP LEDs can be relatively lower compared with other LED forms.

Another form of color tunable white light emitting devices is Chip on Board (COB) in which multiple LED Chips (Dies) are located on a substrate before one or more photoluminescence materials is disposed thereon. The luminous efficacy of white light emitting devices in the form of COB is generally superior to the luminous efficacy of white light emitting devices in the form of CSP. However, COB LEDs can suffer from generation of white light having low color uniformity compared with other forms.

The present invention intends to address and/or overcome the limitations discussed above by presenting new designs and method not hitherto contemplated nor possible by known constructions. More particularly, there is a need for a cost-effective white light emitting device that generates light with improved color uniformity.

SUMMARY OF THE INVENTION

According to an aspect of the present invention, there is provided a white light emitting device comprising a first LED and a second LED disposed on a substrate, a first photoluminescence material layer disposed over at least said first LED, a second photoluminescence material layer disposed over at least said second LED, and a diffusing layer disposed over said first and second photoluminescence layers, said diffusing layer comprising light scattering particles.

The white light emitting device formed according to an embodiment of the present invention exhibits enhanced color uniformity of generated white light due to the combination of the first/second photoluminescence material layers and the diffusing layer disposed thereover. Enhanced color uniformity is particularly advantageous when the device is used in large beam optics. Moreover, compared with CSP LEDs, for example, the amount of photoluminescence material used may also be reduced thereby providing a more cost-effective manner of manufacturing the white light emitting device. This is because the diffusing layer comprising light scattering particles increases the probability that a photon will result in the generation of photoluminescence light by directing light back into the first or second photoluminescence layers. Thus, the amount of photoluminescence material required to generate a given color temperature of light can be reduced since more of the first/second LED light is converted to photoluminescence light owing to the diffusing layer.

Further, COB LEDs provided with a diffusing layer thereon are able to generate white light having a luminous efficacy that is comparable or greater than white light generated by CSP LEDs.

Hence, the present invention is the provision of a white light emitting device that does not suffer from the disadvantages discussed above such as high cost of manufacture and low color uniformity of white light generated.

It may be that the first photoluminescence material layer comprises a first phosphor material and/or the second photoluminescence material layer comprises a second phosphor material. The first and second phosphor materials may be different. It may be that the first photoluminescence material layer comprises a first quantum dot material (QD) and/or the second photoluminescence material layer comprises a second quantum dot (QD) material.

The first phosphor material may be excitable to generate white light having a correlated color temperature of 2700K to 3500K.

The second phosphor material may be excitable to generate white light having a correlated color temperature of 5000K to 6500K.

In this way, the white light emitting device may be a color temperature tunable white light emitting device.

The white light emitting device may comprise alternating arrays of first LEDs and second LEDs. Such a white light emitting device lends itself to a tunable configuration in which the arrays of the first and second LEDs can be arranged according to the desired requirements of light to be generated.

More particularly, the white light emitting device may comprise alternating strips of the first and second photoluminescence material layers associated with the alternating arrays of first LEDs and second LEDs. Such an arrangement is particularly advantageous because it simplifies the manufacturing process thereby reducing costs. For example, compared to CSP LEDs which are individually coated with a photoluminescence material, the inventors have discovered that disposing the first and second photoluminescence materials as "layers" in the form of alternating strips over the first and second LEDs is significantly more time-efficient and cost-effective. That is a plurality of first/second LEDs can be covered/disposed with a first/second photoluminescence material rather that coating each LED individually.

The diffusing layer may be in direct contact with the first and/or second photoluminescence material layer. This may improve the amount of light being scattered by the light scattering particles.

The diffusing layer may comprise a light transmissive material and light scattering particles. The light transmissive material may allow the light scattering material to be suspended therein.

It may be that the light scattering particles are incorporated in the light transmissive material. This may simplify the manufacturing process of the diffusing layer and improve its robustness and reliability.

The light scattering particles may be substantially uniformly distributed through the light transmissive material. Having uniformly distributed light scattering particles within the light transmissive material may enhance the uniformity of light generated by the white light emitting device.

The diffusing layer may comprise a layer of the light transmissive material and a layer of the light scattering particles. The layer of light scattering particles can be deposited directly onto the light layer of light transmissive material by for example screen printing. Alternatively, the layer of light scattering particles can be manufactured separately. This alternative configuration may provide more flexibility in the way the diffusing layer is manufactured, since the light transmissive layer and the layer of light scattering particles may be separately manufactured before assembly, which could be more cost-effective is some instances.

It may be that the layer of the light transmissive material is disposed between the layer of the light scattering particles and the first and/or second photoluminescence material layers. Such a configuration may provide greater distance between the light scattering particles and the first and/or second photoluminescence material layers and this can improve color uniformity since color mixing of light can occur within the layer of light transmissive material.

The layer of the light scattering particles may be disposed between the layer of the light transmissive material and the first and/or second photoluminescence material layers. In such a configuration, the layer of light transmissive material may act as a protective layer to the layers of the light scattering particles and the first and/or second photoluminescence material layers. It may be that the layer of light transmissive is the outermost layer or faces outwardly.

The diffusing layer may comprise two layers of the light transmissive material and a layer of the light scattering particles disposed therebetween. This configuration may provide a greater distance between the light scattering particles and the first and/or second photoluminescence material layers, as well as the layer of light transmissive material may acting as a protective layer.

It may be that at least one of the first photoluminescence material layer, the second photoluminescence material layer, or the diffusing layer comprises light scattering particles. Thus, light scattering particles may be contained in the first photoluminescence material layer and the diffusing layer; in the second photoluminescence material layer and the diffusing layer; or in the first photoluminescence material layer, the second photoluminescence material layer and the diffusing layer. The inclusion of light scattering particles in the first and/or second photoluminescence material layers increases the probability that a photon will result in the generation of photoluminescence light thereby reducing the amount of photoluminescence material required. Further, this inclusion of light scattering particles in the photoluminescence layer(s) may improve the uniformity of the white light generated by the light emitting device generated still further.

The first photoluminescence material layer and/or the second photoluminescence material layer may comprise light scattering particles incorporated in a light transmissive material. The light transmissive material may allow the light scattering particles to be distributed more uniformly by suspension therein, for instance.

The white light emitting device of claim 1, wherein the substrate is light transmissive. The substrate can comprise a circuit board such as a metal core printed circuit board (MCPCB).

The light scattering particles may have an average particle size selected such that they scatter excitation light generated by the first and second LEDs relatively more than they scatter light generated by the first and second photoluminescence material layers, optionally the average particle size may be in a range from about 100 nm to about 200 nm.

One benefit of this approach, especially within the diffuser layer, is that by selecting an appropriate particle size and concentration per unit area of the light scattering particles, an improvement is obtained in the white color appearance of an LED device in its OFF state. Another benefit is an improvement to the color uniformity of emitted light from the white light emitting device for emission angles over a ±60° range from the emission axis. Moreover, the use of a diffusing layer having an appropriate particle size and concentration per unit area of the light scattering particles can substantially reduce the quantity of photoluminescence material required to generate a selected color of emitted light, since the diffusing layer increases the probability that a photon will result in the generation of photoluminescence light by directing light back into the photoluminescence layer(s). It may be that inclusion of a diffusing layer in direct contact with the photoluminescence layer(s) can reduce the quantity of phosphor material required to generate a given color emission product, e.g. by up to 40%. As used herein, "direct contact" means that there are no intervening layers or air gaps.

The light transmissive medium may be disposed between the diffusing layer and the first and/or second photoluminescence layers.

The amount of light scattering particles may vary across the diffusing layer. For instance, there may be more light scattering particles towards the center of the light emitting device than its edges. The center of the light emitting device may be considered the center of the substrate, for instance.

The thickness of the diffusing layer may vary.

The concentration of light scattering particles within the diffusing layer may vary.

By varying the thickness of the light diffusing layer and/or the concentration of light scattering particles within the diffusing layer, the light scattering properties can be appropriately selected depending on the desired output of the white light emitting device.

The light scattering particles may comprise titanium dioxide ($TiO_2$), barium sulfate ($BaSO_4$), magnesium oxide (MgO), silicon dioxide ($SiO_2$) or aluminum oxide ($Al_2O_3$), for example.

The light transmissive material may comprise a curable liquid polymer such as a polymer resin, a monomer resin, an acrylic, an epoxy, a silicone or a fluorinated polymer.

The substrate may comprise a circuit board such as a metal core printed circuit board (MCPCB).

In another aspect, the present invention encompasses a method of manufacturing a white light emitting device, comprising the steps of: providing an array of first LEDs; dispensing a first photoluminescence material layer at least over said array of first LEDs; providing an array of second LEDs; dispensing a second photoluminescence material layer at least over said array of second LEDs; and dispensing a diffusing layer over said first and second photoluminescence material layers.

To reduce the variation in emitted light color with emission angle, the weight loading of light scattering particles to light transmissive material may be in a range from 0.1 to 50% wt or 5 to 10% wt.

In another aspect, the present invention envisages a white light emitting device comprising alternating arrays of first LEDs and second LEDs disposed on a substrate, a first photoluminescence material layer disposed over at least said array of first LEDs, a second photoluminescence material layer disposed over at least said array of second LEDs, and a diffusing layer disposed over said first and second photoluminescence material layers, the diffusing layer comprising light scattering particles, wherein the first photoluminescence material layer comprises a first phosphor material excitable to generate white light having a first correlated color temperature, the second photoluminescence material layer comprises a second phosphor material excitable to generate white light having a second correlated color temperature.

It may be that the first phosphor material is excitable to generate white light having a correlated color temperature of 2700K to 3500K and/or the second phosphor material is excitable to generate white light having a correlated color temperature of 5000K to 6500K.

According to another aspect of the present invention, there is provided a component for a white light emitting device, comprising alternating strips of first and second photoluminescence material layers disposed on a substrate, and a diffusing layer disposed over said alternating strips of first and second photoluminescence material layers, the diffusing layer comprising light scattering particles, wherein the first photoluminescence material layer comprises a first phosphor material excitable to generate white light having a first correlated color temperature, and the second photoluminescence material layer comprises a second phosphor material excitable to generate light having a second correlated color temperature.

It may be that the first correlated color temperature is from 2700K to 3500K and/or the second correlated color temperature is from 5000K to 6500K.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE INVENTION

Figure 1:
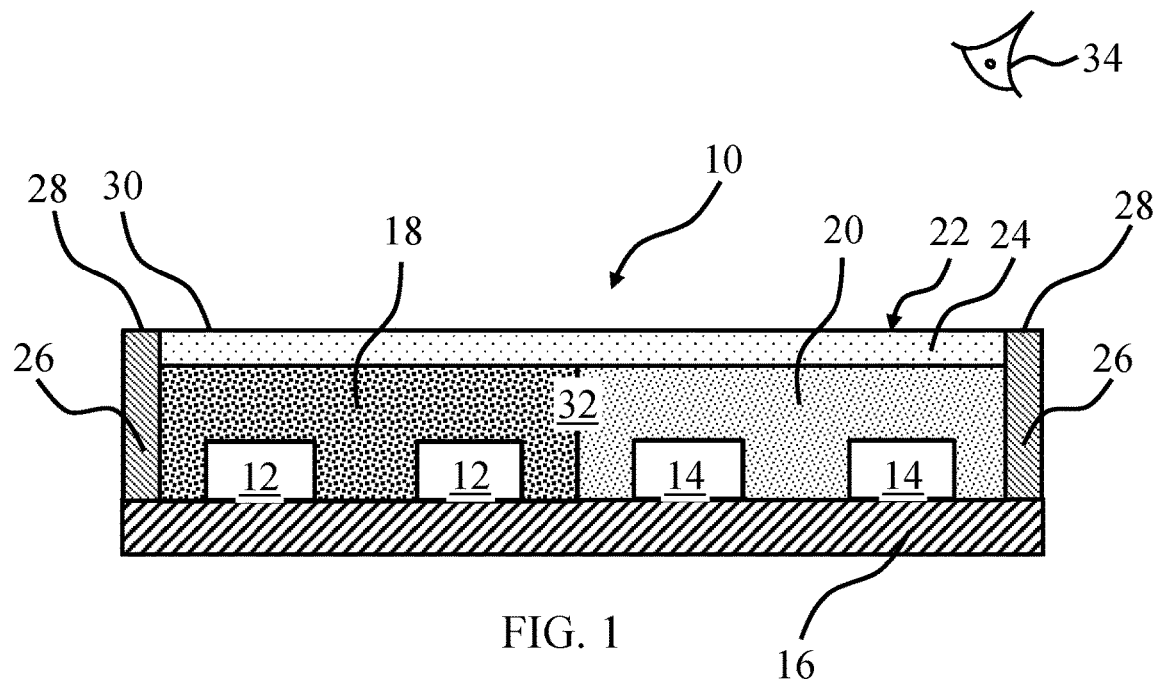
FIG. 1 is a sectional view of a white light emitting device in accordance with an embodiment of the invention.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration. Throughout this specification like reference numerals are used to denote like parts.

A white light emitting device 10 in accordance with an embodiment of the invention will now be described with reference to FIG. 1 which show a sectional side view of the device.

The device 10 comprises first LEDs 12 and second LEDs 14 disposed on a substrate 16 (e.g. MCPCB); a first photoluminescence material layer 18 disposed over at least said first LEDs 12; a second photoluminescence material layer 20 disposed over at least said second LEDs 14; and a diffusing layer 22 disposed over said first and second photoluminescence layers 18, 20; said diffusing layer 22 comprising light scattering particles 24.

Figure 2:
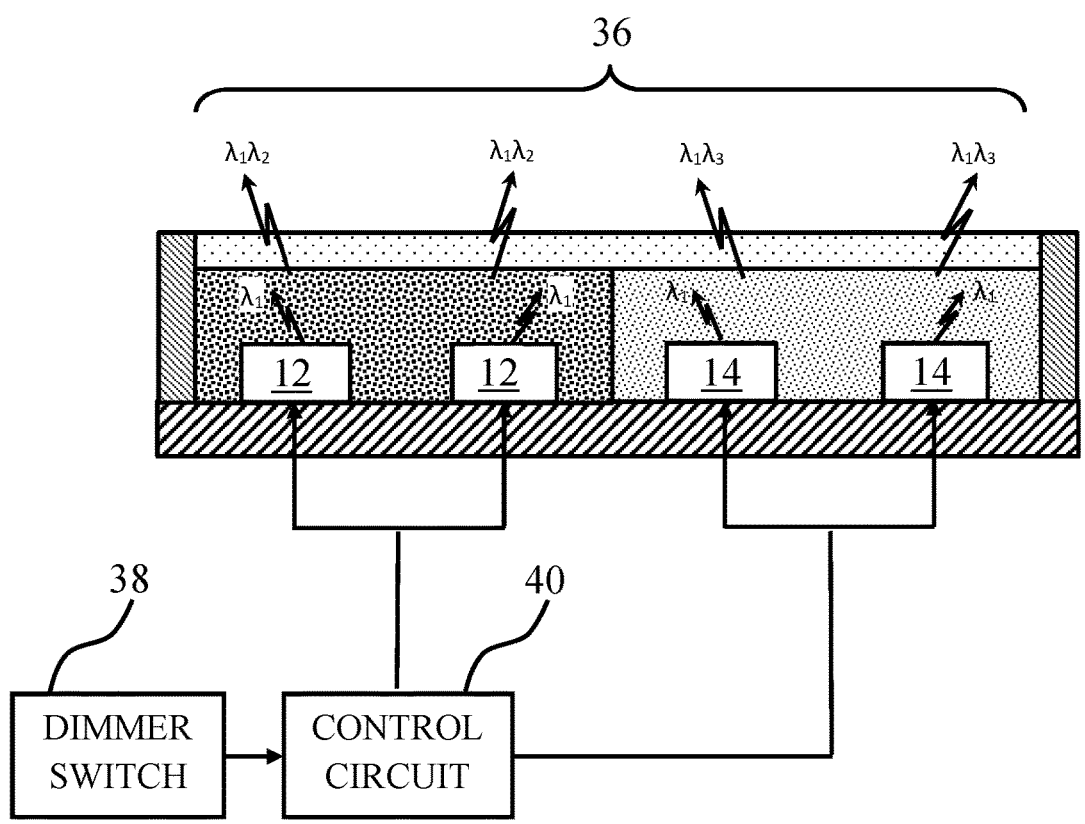
FIG. 2 is a sectional view of the white light emitting device of FIG. 1 with color tunable control.

More particularly, FIG. 1 shows a sectional view of two rows of first LEDs 12 adjacent two rows of second LEDs 14 in a chip on board (COB) type arrangement. Only one LED of each row is shown in FIGS. 1 and 2; there being a total of four rows (two for first LEDs 12 and two rows for second LEDs 14). In this embodiment, the first and second LEDs 12, 14 are InGaN (indium gallium nitride) blue LEDs which are operable to generate blue light having a peak wavelength in a wavelength range 400 to 480 nm (typically 450 to 470 nm). The two rows of first LEDs 12 and two rows of second LEDs 14 are deposited on a planar substrate 16. Towards the edges of the planar substrate 16 is located a peripheral wall 26 which surrounds (encloses) the two rows of first LEDs 12 and two rows of second LEDs 14. Typically, the wall 26 surrounds the two rows of first LEDs 12 and two rows of second LEDs 14. In other embodiments, the wall may delineate one or more sides of the substrate.

A first photoluminescence material layer 18 comprising a first phosphor material (typically green and red emitting phosphor materials) is deposited onto the planar substrate 16 and, in this embodiment, completely covers the two rows of first LEDs 12. The first phosphor material is excitable to generate white light having a correlated color temperature of about 2700K to 3500K (warm white light). Similarly, the second photoluminescence material layer 20 comprising a second phosphor material (Typically a green phosphor material) is deposited onto the planar substrate 16 and, in this embodiment, completely covers the two rows of second LEDs 14. The second phosphor material is excitable to generate white light having a correlated color temperature of 5000K to 6500K (cool white light). In this way, the first and second photoluminescence material layers 18, 20 are located adjacent one another and also contained within the wall 26.

A planar diffusing layer 22, having similar dimensions to those of the planar substrate 16, is disposed over and on top of both the first photoluminescence material layer 18 and second photoluminescence material layer 20, and is also contained inside the wall 26. The upper surfaces 28 of the upright walls 26 together with the upper surface 30 of the planar diffusing layer 22 define a flush surface. The planar diffusing layer 22, the planar substrate 16, and wall 26 define an interior volume 32 which houses and encloses the first and second photoluminescence material layers 18, 20 and the two rows of first LEDs 12 and the two rows of second LEDs 14.

The white light emitting device 10, to an observer 34, exhibits enhanced color uniformity of generated white light due to the combination of the first and second photoluminescence material layers 18, 20 and the diffusing layer 22 disposed thereover. Compared with CSP LEDs, for example, the amount of photoluminescence material used may also be reduced thereby providing a more cost-effective manner of manufacturing the white light emitting device 10. This is because the diffusing layer 22 comprising light scattering particles 24 increases the probability that a photon will result in the generation of photoluminescence light by directing light back into the first or second photoluminescence layers. Thus, the amount of photoluminescence material required to generate a given color temperature of light can be reduced since more of the first/second LED 12, 14 light is converted to photoluminescence light owing to the diffusing layer 22.

Referring now to FIG. 2, there is shown the white light emitting device of FIG. 1 with dimming control. The first and second photoluminescence material layers 18, 20 are operable to absorb a proportion of the blue light $\lambda_1$ generated by the two rows of first LEDs 12 and the two rows of second LEDs 14 and convert it to light of a different wavelength by a process of photoluminescence. In this embodiment, the first photoluminescence material layer 18 converts the blue light $\lambda_1$ to $\lambda_2$, and the second photoluminescence material layer 18 converts the blue light $\lambda_1$ to $\lambda_3$. Not all of the blue light $\lambda_1$ generated by the two rows of first LEDs 12 and the two rows of second LEDs 14 is absorbed by the first and second photoluminescence material layers 18, 20 and some of it is emitted through the diffusing layer 22. The emission product 36 of the white light emitting device 10 thus comprises the combined light of wavelengths $\lambda_1$, $\lambda_2$, $\lambda_3$ generated by the by the two rows of first LEDs 12 and the two rows of second LEDs 14 and the first and second photoluminescence material layers 18, 20. The CCT of the emission product 36 is thus a combination of the CCT of light ($\lambda_1$) generated by the two rows of first LEDs 12 and the two rows of second LEDs 14, the CCT of light ($\lambda_2$) generated by the first photoluminescence material layer 18, and the CCT of light ($\lambda_3$) generated by the second photoluminescence material layer 20.

In this embodiment, the combination of light ($\lambda_1$) generated by the two rows of first LEDs 12 and light ($\lambda_2$) generated by the first photoluminescence material layer 18 generates light having a CCT corresponding to a warm yellowish white (a correlated color temperature of about 2700K to 3500K). Similarly, the combination of light ($\lambda_1$) generated by the two rows of second LEDs 14 and light ($\lambda_3$) generated by the second photoluminescence material layer 20 generates light having a CCT corresponding to a cool blueish white (a correlated color temperature of about 5000K to 6500K). Therefore, the emission product 34 of the white light emitting device 10 in this example would be a combination of the warm yellowish white light deriving from ($\lambda_1$)/($\lambda_2$), the cool blueish white light deriving from ($\lambda_1$)/($\lambda_3$).

A dimmer switch 38 may be operably connected to a control circuit 40 which is operably connected to the two rows of first LEDs 12 and the two rows of second LEDs 14. The dimmer switch 38 is configured to generate a continuous range of output powers to be used for controlling (tuning) the color temperature and dimming level of the white light emitting device 10. The control circuit 40 is configured to translate the generated output power into an on/off arrangement and/or adjustable power arrangement for the two rows of first LEDs 12 and the two rows of second LEDs 14.

While the variation in color temperature of an incandescent light bulb is directly related to the output power of the dimmer switch, the CCT of the emission product 36 of the light emitting device 10 is not directly related to the output power of the dimmer switch 38. As such, the control circuit 40 must translate the output power of the dimmer switch 38 into a control arrangement for the two rows of first LEDs 12 and the two rows of second LEDs 14 such that the white light emitting device 10 dimming behavior resembles that of a dimmable incandescent light bulb—that is on dimming its color temperature changes from cool white at full power to warm white when dimmed.

Because the emission product 36 of the white light emitting device 10 is a combination of light ($\lambda_1$) generated by the two rows of first LEDs 12 and the two rows of second LEDs 14 and light ($\lambda_2$, $\lambda_3$) generated by the first and second photoluminescence material layers 18, 20, the CCT of the emission product 36 can be changed by modifying the combination of light. In this way, a CCT corresponding to a warm yellowish white color may be generated by having a larger portion of the emission product 36 originate from the first photoluminescence material layer 18 (e.g., region generating light with a CCT corresponding to a warm yellowish white) and a smaller portion of the emission product 36 originate from the second photoluminescence material layer 20 (e.g., region generating light with a CCT corresponding to a cool blueish white). A CCT corresponding to a cool bluish white color may be generated by having a smaller portion of the emission product 36 originate from the first photoluminescence material layer 18 and a larger portion of the emission product 36 originate emanate from the second photoluminescence material layer 20.

The emission product 36 may be modified, for example, by altering the on/off configuration of the two rows of first LEDs 12 and the two rows of second LEDs 14. Thus, the CCT of the emission product 36 may grow closer to a warm yellowish color as some or all of the second LEDs 14 corresponding to the second photoluminescence material layer 20 are turned off while the two rows of first LEDs 12 corresponding to the first photoluminescence material layer 18 remain on. Conversely, if a emission product 36 having a CCT with a cool blueish is color is desired, some or all of the first LEDs 12 corresponding to the first photoluminescence material layer 18 may be turned off while the two rows of second LEDs 14 corresponding to the second photoluminescence material layer 20 remain on.

Thus, by configuring the control circuit 40 of the white light emitting device 10 to translate output power of the dimmer switch 38 into a corresponding on/off configuration of the two rows of first LEDs 12 and the two rows of second LEDs 14, the white light emitting device 10 may be tuned like a typical incandescent light bulb.

Alternatively, in another embodiment, instead of an on/off control, individual power levels (typically current) are adjusted by the control circuit 40 to the two rows of first LEDs 12 and the two rows of second LEDs 14, so that a selected ratio of the emissions $\lambda_2$, $\lambda_3$ from the first and second photoluminescence material layers 18, 20 is obtained to generate a desired CCT of the emission product 36. In this approach, the CCT of the emission product 36 corresponds to a cool blueish white color or a warm yellowish white color depending upon the relative amounts of power that are provided to the two rows of first LEDs 12 and the two rows of second LEDs 14.

Figure 3A:
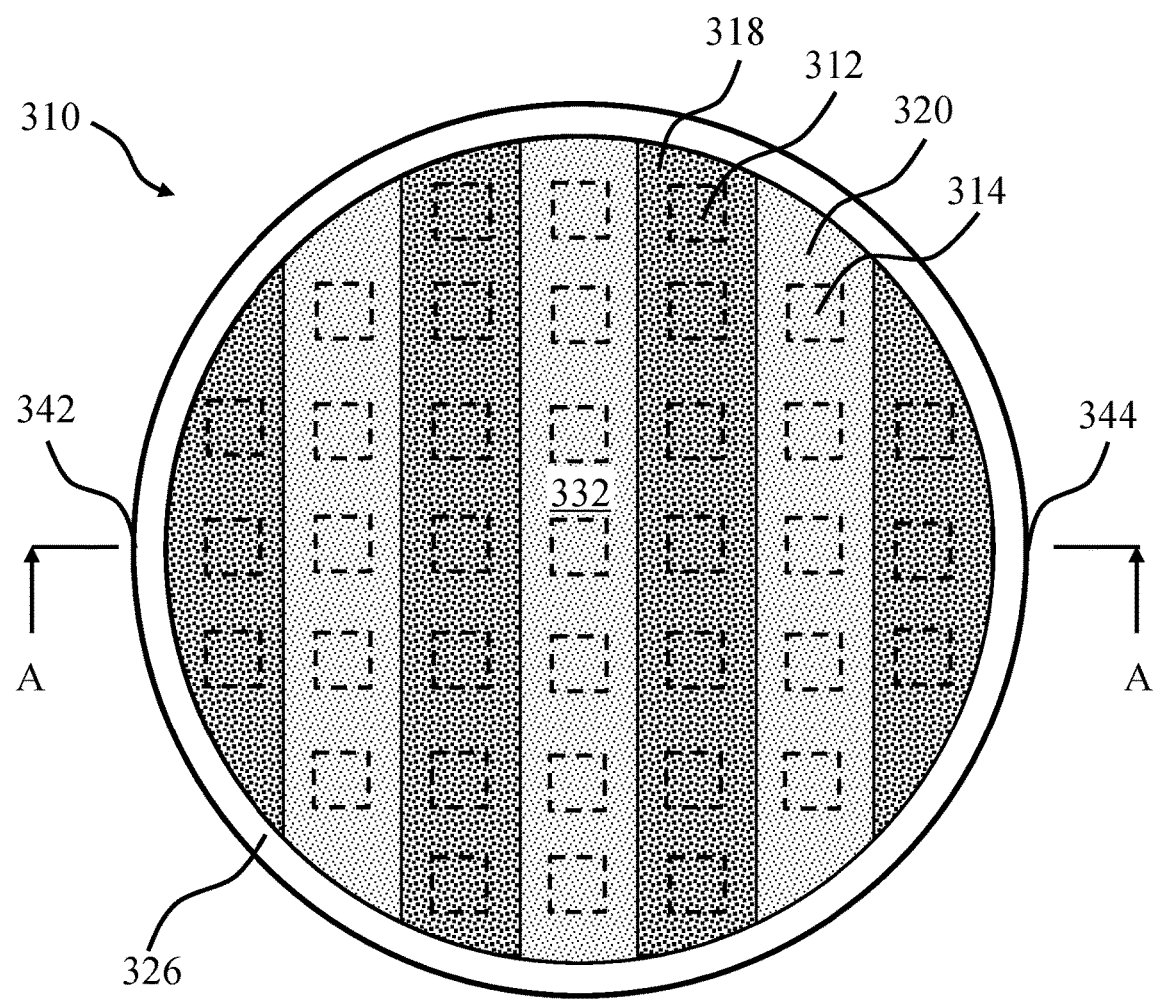
FIG. 3A is a plan view of a white light emitting device in accordance with an embodiment of the invention.
Figure 3B:
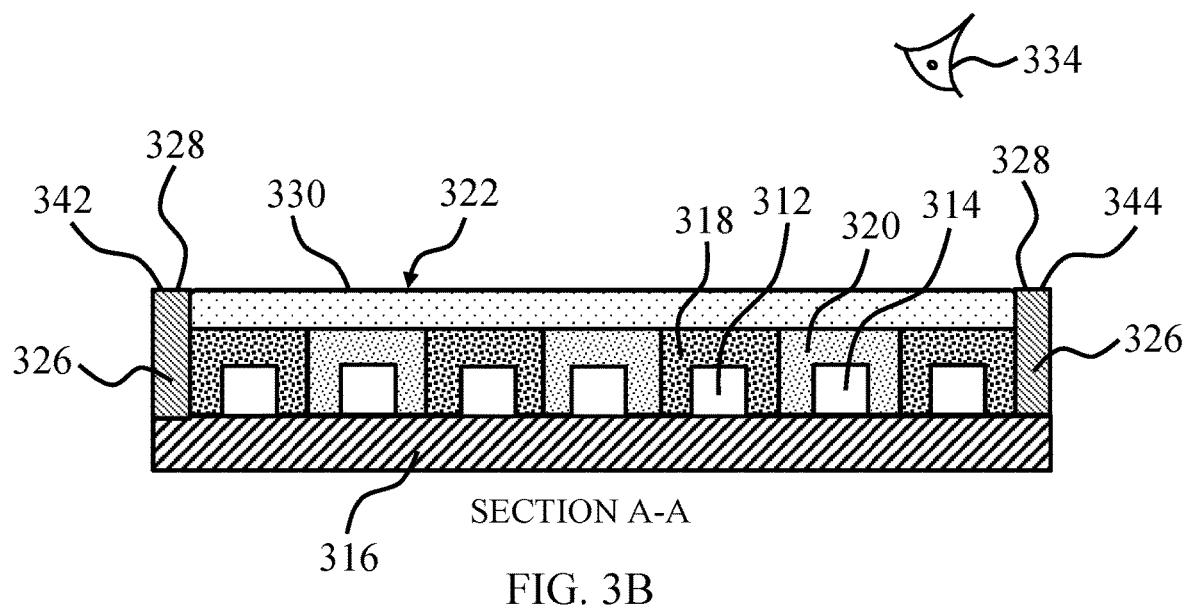
FIG. 3B is cross sectional side view through A-A.

With reference to FIGS. 3A and 3B, there is shown a plan view of a white light emitting device 310 in accordance with an embodiment of the invention, and a cross section side view through A-A (of FIG. 3A). The white light emitting device 310 is similar to the white light emitting device 10 of FIG. 1. Therefore, like reference numerals are used in FIG. 3 to denote like features.

In this embodiment, the white light emitting device 310 has a circular shape. Thus, the substrate 316 is planar and disk shaped. Forming another chip on board arrangement, alternating arrays (rows) of first LEDs 312 and second LEDs 314 are configured from one circumferential point 342 to the diametrically opposing circumferential point 344. In this embodiment, the arrays are in the form of rows. As illustrated, the circular substrate 316 comprises a total of seven rows of alternating arrays of first LEDs 312 and second LEDs 314, wherein the first and second LEDs 312, 314 are substantially symmetrically distributed over the entirety on the circular substrate 316. The circular substrate 316 also comprises about its entire perimeter a wall 326 which encloses all the arrays of first LEDs 312 and second LEDs 314. In this embodiment, the first and second LEDs 312, 314 are InGaN (indium gallium nitride) blue LEDs which are operable to generate blue light having a peak wavelength in a wavelength range 400 to 480 nm (typically 450 to 470 nm).

A first photoluminescence material layer 318 comprising a first phosphor material (typically green and red emitting phosphor materials) is deposited onto the circular substrate 316 and, in this embodiment, completely covers the arrays of first LEDs 312. The first phosphor material is excitable to generate white light having a correlated color temperature of about 2700K to 3500K (warm white light). Similarly, the second photoluminescence material layer 320 comprising a second phosphor material (typically a green phosphor material) is deposited onto the circular substrate 316 and, in this embodiment, completely covers the arrays of second LEDs 314. The second phosphor material is excitable to generate white light having a correlated color temperature of 5000K to 6500K (cool white light). In this way, the first and second photoluminescence material layers 18, 20 are located adjacent one another and also contained within the upright walls 26. In this way, the white light emitting device 310 comprises a total of seven alternating strips of the first and second photoluminescence material layers 18, 20 associated with the alternating arrays of first and second LEDs 312, 314.

A circular and planar diffusing layer 322, having slightly smaller dimensions to those of the circular substrate 316, is disposed over and on top of both the first photoluminescence material layer 318 and second photoluminescence material layer 320, and is also contained inside the upright wall 26. The upper surface 328 of the upright wall 326 together with the upper surface 330 of the circular diffusing layer 322 define a flush surface. The circular diffusing layer 322, the circular substrate 316, and wall 326 define an interior volume 332 which houses and encloses the first and second photoluminescence material layers 18, 20 and the alternating arrays of first LEDs 312 and second LEDs 314.

A method of manufacturing the white light emitting device 310, for example, comprises the steps of: providing an array of first LEDs 312; dispensing a first photoluminescence material layer 318 at least over said array of first LEDs 312; providing an array of second LEDs 314; dispensing a second photoluminescence material layer 320 at least over said array of second LEDs 314; and dispensing a diffusing layer 322 over said first and second photoluminescence material layers 318, 320. In this embodiment, the diffusing layer 322 is in direct contact with the first and second photoluminescence material layers 318, 320. Although, it will be appreciated that, in other embodiments, the diffusing layer may be in direct contact with only the first or second photoluminescence material layer.

The white light emitting device 310, to an observer 334, exhibits enhanced color uniformity of generated white light due to the combination of the first and second photoluminescence material layers 18, 20 and the diffusing layer 322 disposed thereover. Compared with CSP LEDs, for example, the amount of photoluminescence material used may also be reduced thereby providing a more cost-effective manner of manufacturing the white light emitting device 310. This is because the diffusing layer 322 comprising light scattering particles 324 increases the probability that a photon will result in the generation of photoluminescence light by directing light back into the first or second photoluminescence layers. Thus, the amount of photoluminescence material required to generate a given color temperature of light can be reduced since more of the first/second LED 312, 314 light is converted to photoluminescence light owing to the diffusing layer 322.

Table 1 tabulates values for a white light emitting device without a diffusing layer. More particularly, the white light emitting device comprises a first LED and a second LED disposed on a substrate, a first photoluminescence material layer disposed over at least said first LED, a second photoluminescence material layer disposed over at least said second LED. The device having a nominal correlated color temperature (CCT) of 2700 K. A first batch containing six samples of the device without a diffusing layer were prepared and tested, and the parameter data including light intensity (lm), luminous efficacy LE (lm/W), chromaticity CIE x,y, CRI-Ra, and CRI-R9 for each sample is shown in Table 1 together with an average value for each parameter.

TABLE 1

White light emitting device performance without a diffusing layer

| Number | Intensity (lm) | LE (lm/W) | Chromaticity CIE x | CIE y | CCT (K) | CRI Ra | R9 |
|---|---|---|---|---|---|---|---|
| 1 | 1980.0 | 112.1 | 0.4631 | 0.4216 | 2740 | 95.0 | 67.3 |
| 2 | 1991.0 | 112.8 | 0.4632 | 0.4212 | 2735 | 95.1 | 68.0 |
| 3 | 2007.0 | 113.8 | 0.4636 | 0.4212 | 2729 | 95.2 | 68.4 |
| 4 | 1979.0 | 112.3 | 0.4628 | 0.4210 | 2740 | 95.0 | 67.4 |
| 5 | 1976.0 | 113.3 | 0.4626 | 0.4195 | 2731 | 95.5 | 69.5 |
| 6 | 1979.0 | 112.5 | 0.4618 | 0.4203 | 2747 | 94.7 | 66.4 |
| Avg | 1985.3 | 112.8 | 0.4629 | 0.4208 | 2737 | 95.1 | 67.8 |

Table 2 tabulates values for a white light emitting device having a 5% wt diffusing layer. More particularly, the white light emitting device comprising a first LED and a second LED disposed on a substrate, a first photoluminescence material layer disposed over at least said first LED, a second photoluminescence material layer disposed over at least said second LED, and a diffusing layer disposed over said first and second photoluminescence layers, said diffusing layer comprising light scattering particles. The 5% wt diffusing layer denotes a loading of 5 weight percent of scattering particles in 95 weight percent liquid silicone (e.g. light transmissive material). The device having a nominal correlated color temperature (CCT) of 2700 K. The first batch containing six samples of the device with a 5% wt diffusing layer were prepared and tested, and the parameter data including light intensity (lm), CIE x,y, CRI-Ra, and CRI-R9 for each sample is shown in Table 2 together with an average value for each parameter.

TABLE 2

White light emitting device performance without a diffusing layer

| Number | Intensity (lm) | LE (lm/W) | Chromaticity CIE x | CIE y | CCT (K) | CRI Ra | R9 |
|---|---|---|---|---|---|---|---|
| 1 | 1960.0 | 110.85 | 0.4668 | 0.4247 | 2712 | 94.4 | 64.7 |
| 2 | 1980.0 | 112.02 | 0.4669 | 0.4240 | 2705 | 94.6 | 65.3 |
| 3 | 1990.0 | 112.84 | 0.4674 | 0.4243 | 2701 | 94.6 | 65.7 |
| 4 | 1960.0 | 111.22 | 0.4665 | 0.4243 | 2713 | 94.4 | 64.4 |
| 5 | 1950.0 | 111.79 | 0.4664 | 0.4228 | 2703 | 94.9 | 66.5 |
| 6 | 1960.0 | 111.38 | 0.4656 | 0.4235 | 2720 | 94.2 | 63.6 |
| Avg | 1966.7 | 111.68 | 0.4666 | 0.4239 | 2709 | 94.5 | 65.0 |

Comparing the average data values of Tables 1 and 2, it can be seen that by including a 5% wt diffusing layer there is a negligible change in CIE x (0.46289 compared with 0.4666), CIE y (0.4208 compared with 0.4239), CRI-Ra (95.1 compared with 94.5), and CRI-R9 (67.8 compared with 65.0). Tables 1 and 2 also show that there is only a negligible change in light intensity (1985.3 lm compared with 1966.7 lm) and luminous efficacy (112.8 lm/W compared with 111.7 lm/W). Therefore, the data demonstrates that the performance and characteristics of the white light emitting device do not degrade with the inclusion of a 5% wt diffusing layer. However, the observer will observe a significant improvement in the color uniformity of light generated by the white light emitting device formed according to the invention, compared with a device devoid of a diffusing layer. The inventors have also found that the white light emitting device of the present invention advantageously has a superior light intensity output and luminous efficacy than an equivalent device utilizing CSP LEDs without a diffusing layer.

Table 3 tabulates values for a white light emitting device without a diffusing layer. More particularly, the white light emitting device comprises a first LED and a second LED disposed on a substrate, a first photoluminescence material layer disposed over at least said first LED, a second photoluminescence material layer disposed over at least said second LED. The device having a nominal correlated color temperature (CCT) of 2700 K. A second batch containing six samples of the device without a diffusing layer were prepared and tested, and the parameter data including light intensity (lm), efficacy (lm/W), CIE x,y, CRI-Ra, and CRI-R9 for each sample is shown in Table 3 together with an average value for each parameter.

TABLE 3

White light emitting device performance without a diffusing layer

| Number | Intensity (lm) | LE (lm/W) | Chromaticity CIE x | CIE y | CCT (K) | CRI Ra | R9 |
|---|---|---|---|---|---|---|---|
| 7 | 1958.0 | 111.4 | 0.4641 | 0.4217 | 2726 | 95.1 | 68.1 |
| 8 | 1991.0 | 113.4 | 0.4628 | 0.4214 | 2742 | 95.0 | 67.3 |
| 9 | 1953.0 | 110.7 | 0.4631 | 0.4199 | 2726 | 95.5 | 69.4 |
| 10 | 1994.0 | 113.1 | 0.4630 | 0.4216 | 2741 | 94.9 | 67.3 |
| 11 | 2000.0 | 113.1 | 0.4647 | 0.4211 | 2714 | 94.8 | 65.5 |
| Avg | 1979.2 | 112.3 | 0.4635 | 0.4211 | 2730 | 95.1 | 67.5 |

Table 4 tabulates values for a white light emitting device having a 10% wt diffusing layer. More particularly, the white light emitting device comprising a first LED and a second LED disposed on a substrate, a first photoluminescence material layer disposed over at least said first LED, a second photoluminescence material layer disposed over at least said second LED, and a diffusing layer disposed over said first and second photoluminescence layers, said diffusing layer comprising light scattering particles. The 10% wt diffusing layer denotes a loading of 5 weight percent of scattering particles in 90 weight percent liquid silicone (e.g. light transmissive material). The device having a nominal correlated color temperature (CCT) of 2700 K. The second batch containing six samples of the device with a 10% wt diffusing layer were prepared and tested, and the parameter data including light intensity (lm), efficacy (lm/W), CIE x,y, CRI-Ra, and CRI-R9 for each sample is shown in Table 4 together with an average value for each parameter.

TABLE 4

White light emitting device performance without a diffusing layer

| Number | Intensity (lm) | LE (lm/W) | Chromaticity CIE x | CIE y | CCT (K) | CRI Ra | R9 |
|---|---|---|---|---|---|---|---|
| 7 | 1920.0 | 109.2 | 0.4720 | 0.4260 | 2653 | 94.5 | 64.6 |
| 8 | 1940.0 | 110.4 | 0.4711 | 0.4258 | 2663 | 94.3 | 63.8 |
| 9 | 1910.0 | 108.2 | 0.4713 | 0.4243 | 2650 | 94.9 | 65.9 |
| 10 | 1950.0 | 110.5 | 0.4713 | 0.4259 | 2662 | 94.4 | 64.0 |
| 11 | 1960.0 | 110.7 | 0.4729 | 0.4253 | 2636 | 94.9 | 66.8 |
| Avg | 1936.0 | 109.8 | 0.4717 | 0.4246 | 2653 | 94.6 | 65.0 |

Comparing the average data values of Tables 3 and 4, it can be seen that by including a 10% wt diffusing layer there is only a negligible change in CIE x (0.4635 compared with 0.4717), CIE y (0.4211 compared with 0.42456), CRI-Ra (95.1 compared with 94.6), and CRI-R9 (67.5 compared with 65.0). Tables 3 and 4 also show that there is only a negligible change in light intensity (1985.3 lm compared with 1966.7 lm) and luminous efficacy (112.3 lm/W compared with 109.8 lm/W). Therefore, the data demonstrates that the performance and characteristics of the white light emitting device do not degrade with the inclusion of a 10% wt diffusing layer. However, the observer will observe a significant improvement in the color uniformity of light generated by the white light emitting device formed according to the invention, compared with a device devoid of a diffusing layer.

Figure 4:
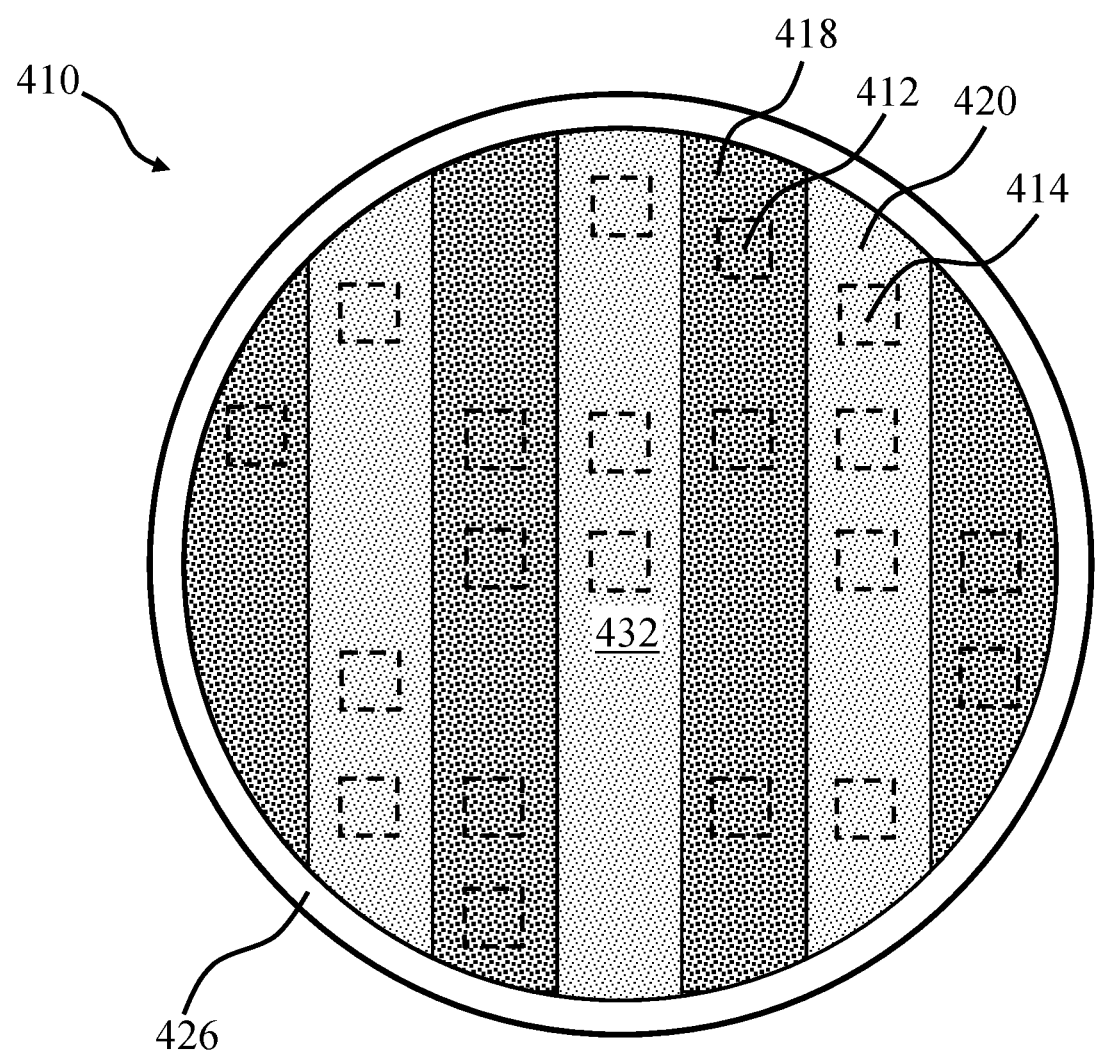
FIG. 4 is a plan view of a white light emitting device in accordance with an embodiment of the invention.

Referring to FIG. 4, there is shown a white light emitting device 410 formed according to an embodiment of the invention. The white light emitting device 410 is the same as the white light emitting device 310 shown in FIG. 3A except that it comprises fewer first and second LEDs 412, 414. More particularly, the first and second LEDs 412, 414 are substantially non-symmetrically (non-uniformly) distributed. Despite, the non-symmetrical distribution, the observer 434 (not shown) exhibits enhanced color uniformity of generated white light due to the combination of the first and second photoluminescence material layers 418, 420 and the diffusing layer 422 (not shown) disposed thereover. Compared with CSP LEDs, for example, the amount of photoluminescence material used may also be reduced thereby providing a more cost-effective manner of manufacturing the white light emitting device 410. This is because the diffusing layer 422 (not shown) comprising light scattering particles 424 (not shown) increases the probability that a photon will result in the generation of photoluminescence light by directing light back into the first or second photoluminescence layers 418, 420. Thus, the amount of photoluminescence material required to generate a given color temperature of light can be reduced since more of the first/second LED 412, 414 light is converted to photoluminescence light owing to the diffusing layer 422 (not shown).

Figure 5:
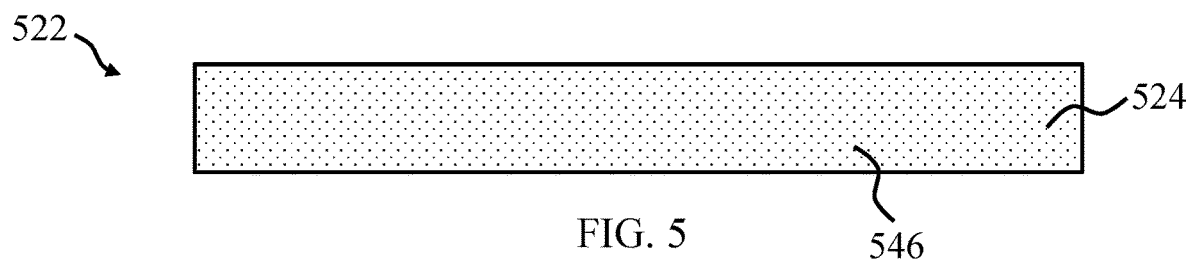
FIG. 5 is a sectional view of a diffusing layer in accordance with an embodiment of the invention.

Referring to FIG. 5, there is shown a side sectional view of an embodiment of a diffusing layer 522. The diffusing layer 522 has a rectangular cross section and is essentially planar in form. The diffusing layer 522 comprises a light transmissive material 546 and light scattering particles 524. In this embodiment, the light scattering particles 524 are incorporated in the light transmissive material 546 and are substantially uniformly distributed through the light transmissive material 546. However, it will be appreciated that in other embodiments the light scattering particles may not be uniformly distributed in a light transmissive medium/material. The light scattering particles 524 can have an average particle size selected such that they scatter excitation light generated by the first and second LEDs relatively more than they scatter light generated by the first and second photoluminescence material layers, and in this embodiment the average particle size being in a range from about 100 nm to about 200 nm. The light scattering particles 524 are formed from titanium dioxide or other materials as defined herein.

Figure 6:
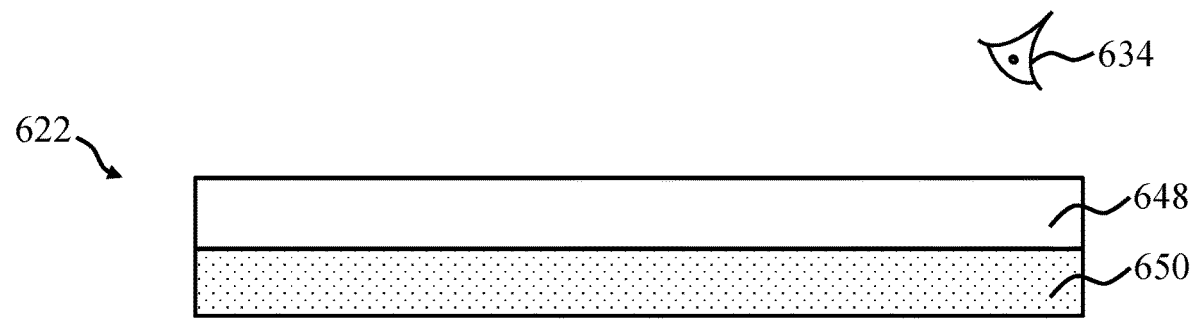
FIG. 6 is a sectional view of a diffusing layer in accordance with another embodiment of the invention.

Referring to FIG. 6, there is shown a side sectional view of another embodiment of a diffusing layer 622. Similar to the embodiment of FIG. 5, the diffusing layer 622 has a rectangular cross section and is essentially planar in form. However, in this embodiment the diffusing layer 622 comprises a layer of the light transmissive material 648 and a layer of the light scattering particles 650. The layer of light scattering particles 650 may be formed in accordance with the diffusing layer 522 of FIG. 5, for instance. As shown in FIG. 6, the layer of the light transmissive material 648 is directly in contact with and disposed above the layer of the light scattering particles 650 so that the layer of the light transmissive material 648 appears closest to the observer 634.

Figure 7:
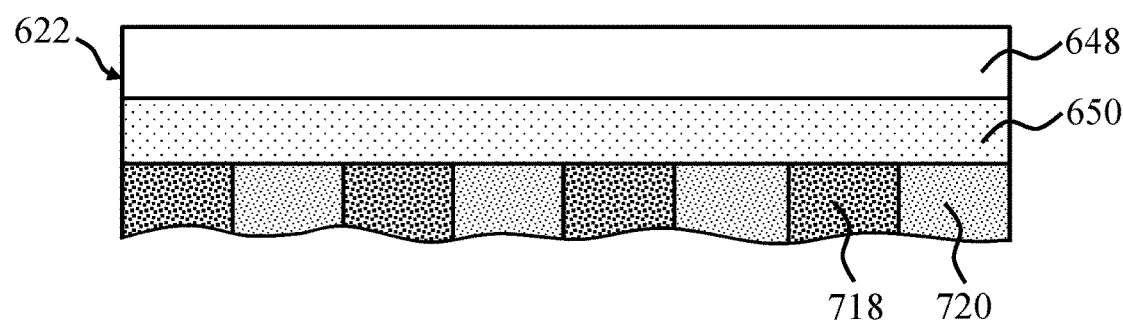
FIG. 7 is a sectional view of a diffusing layer in contact with photoluminescence material layers in accordance with an embodiment of the invention.

Referring to FIG. 7, there is shown a side sectional view of the diffusing layer 622 of FIG. 6 directly in contact with and disposed above alternating strips of first and second photoluminescence material layers 718, 720 (partially shown in FIG. 7). In this arrangement, as seen from an observer 734, the layer of light transmissive material 648 is the outermost layer and faces outwardly towards the observer 734. More particularly, the layer of the light scattering particles 650 is disposed between the layer of the light transmissive material 648 and the alternating strips of first and second photoluminescence material layers 718, 720. In such a configuration, the layer of light transmissive material 648 may act as a protective layer to the layer of the light scattering particles 650 and the alternating strips of first and second photoluminescence material layers 718, 720.

Figure 8:
FIG. 8 is a sectional view of a diffusing layer in contact with photoluminescence material layers in accordance with another embodiment of the invention.
Figure 8:
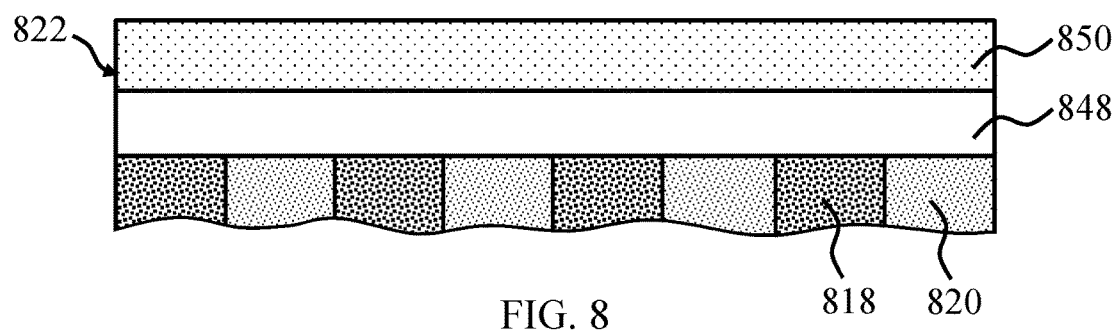

Referring to FIG. 8, there is shown a side sectional view of an alternative embodiment of a diffusing layer 822 directly in contact with and disposed above alternating strips of first and second photoluminescence material layers 818, 820 (partially shown in FIG. 8). The diffusing layer 822 is the same as the diffusing layer 622 of FIGS. 6 and 7, except that the layer of the light scattering particles is transposed with the layer of the light transmissive material. Hence, in this arrangement, as seen from an observer 834, the layer of the light scattering particles 850 is the outermost layer and faces outwardly towards the observer 834. More particularly, the layer of the light transmissive material 848 is disposed between the layer of the light scattering particles 850 and the alternating strips of first and second photoluminescence material layers 818, 820. In such a configuration, provides greater distance between the layer of light scattering particles 850 and the first and second photoluminescence material layers 818, 820.

Figure 9:
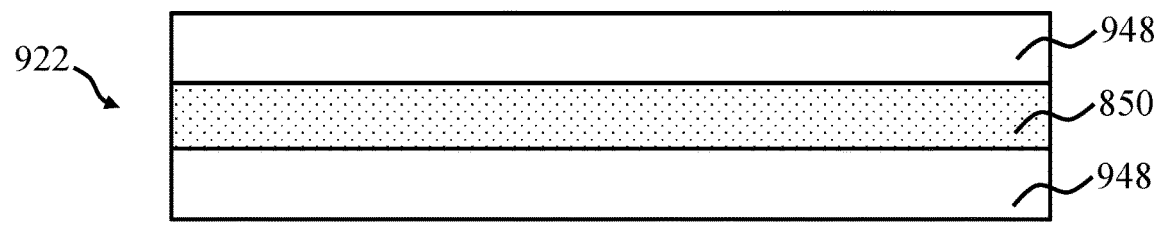
FIG. 9 is a sectional view of a diffusing layer in accordance with another embodiment of the invention.

Referring to FIG. 9, there is shown a side sectional view of a diffusing layer 922 in accordance with another embodiment of the invention. In this embodiment, the diffusing layer 922 comprises two layers of the light transmissive material 948 and a layer of the light scattering particles 950 disposed therebetween. This configuration provides a greater distance between the layer of light scattering particles 950 and the first and second photoluminescence material layers 918,920, as well as the layers of light transmissive material 948 acting as a protective layer.

Figure 10:
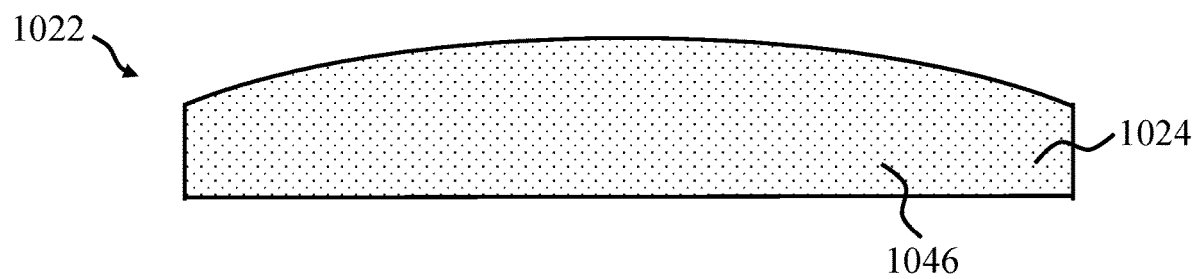
FIG. 10 is a sectional view of a diffusing layer in accordance with another embodiment of the invention.

Referring to FIG. 10, there is shown a side sectional view of a diffusing layer 1022 in accordance with another embodiment of the invention. In this embodiment, the diffusing layer 1022 is the same as the diffusing layer 522 of FIG. 5, except the diffusing layer 1022 has a different shape (Convex shape). The diffusing layer 1022 has a shape having a cross section which is rectangular with an arch along one of its longer sides. Thus, the cross section defines a shape in which the thickness of the diffusing layer 1022 varies across its width. Of course, it will be appreciated that the thickness of the diffusing layer may vary across its length, in other embodiments. In this way, the amount of light scattering particles 1024 may vary across the diffusing layer 1022. For instance, in this embodiment, there are more light scattering particles 1024 towards the center of the light diffusing layer 1022 than its edges. By varying the thickness of the light diffusing layer 1022, the light scattering properties can be appropriately selected depending on the desired output of the white light emitting device with which it is utilized.

Figure 11:
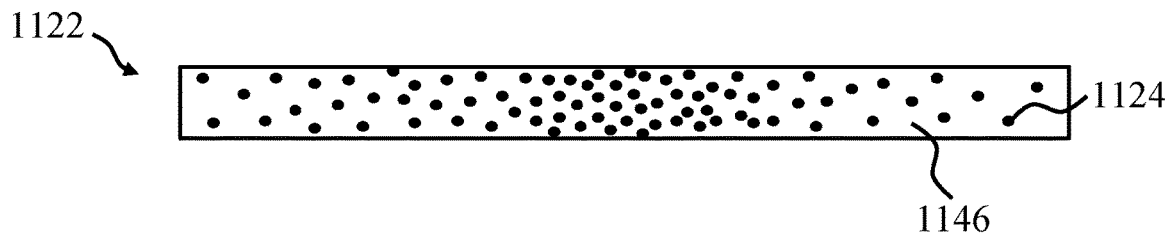
FIG. 11 is a sectional view of a diffusing layer in accordance with another embodiment of the invention.

Referring to FIG. 11, there is shown a side sectional view of a diffusing layer 1122 in accordance with another embodiment of the invention. In this embodiment, the diffusing layer 1122 is the same as the diffusing layer 522 of FIG. 5, except the diffusing layer 1122 has a different distribution of light scattering particles 1124 within the light transmissive material 1146. In this embodiment, the light scattering particles 1124 are incorporated in the light transmissive material 1146 and are not uniformly distributed through the light transmissive material 1146. Instead, in this embodiment, the concentration of light scattering particles 1124 within the diffusing layer 1124 varies along its width. Of course, it will be appreciated that the concentration of light scattering particles 1124 within the diffusing layer 1124 may vary across its length, in other embodiments. In this way, the amount of light scattering particles 1124 may vary across the diffusing layer 1122. For instance, in this embodiment, there is a higher concentration of light scattering particles 1124 towards the center of the light diffusing layer 1122 than its edges. By varying the concentration of light scattering particles 1124 in the light diffusing layer 1022, the light scattering properties can be appropriately selected depending on the desired output of the white light emitting device with which it is utilized.

Figure 12:
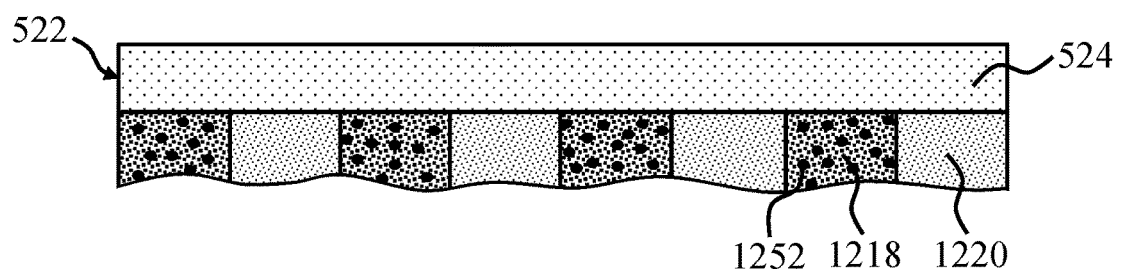
FIG. 12 is a sectional view of a diffusing layer in contact with photoluminescence material layers in accordance with another embodiment of the invention.

FIG. 12 is a sectional view of the diffusing layer 522 of FIG. 5 directly in contact with and disposed above alternating strips of first and second photoluminescence material layers 1218, 1220 (partially shown in FIG. 12). In this embodiment, while the diffusing layer 522 comprises light scattering particles 524, the first photoluminescence material layer 1218 also comprises light scattering particles 1252. This may improve the uniformity of the white light generated by the light emitting device generated still further.

Figure 13:
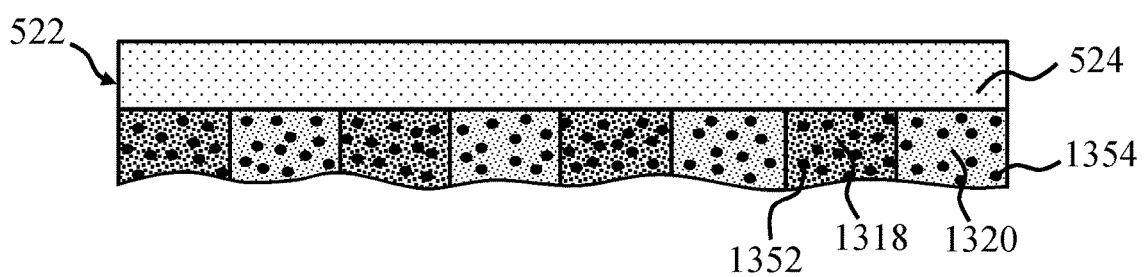
FIG. 13 is a sectional view of a diffusing layer in contact with photoluminescence material layers in accordance with another embodiment of the invention.

FIG. 13 is a sectional view of the diffusing layer 522 of FIG. 5 directly in contact with and disposed above alternating strips of first and second photoluminescence material layers 1318, 1320 (partially shown in FIG. 13). In this embodiment, while the diffusing layer 522 comprises light scattering particles 524, the first and second photoluminescence material layers 1318, 1320 also comprise light scattering particles 1352, 1354 respectively. This may improve the uniformity of the white light generated by the light emitting device generated even further.

Figure 14:
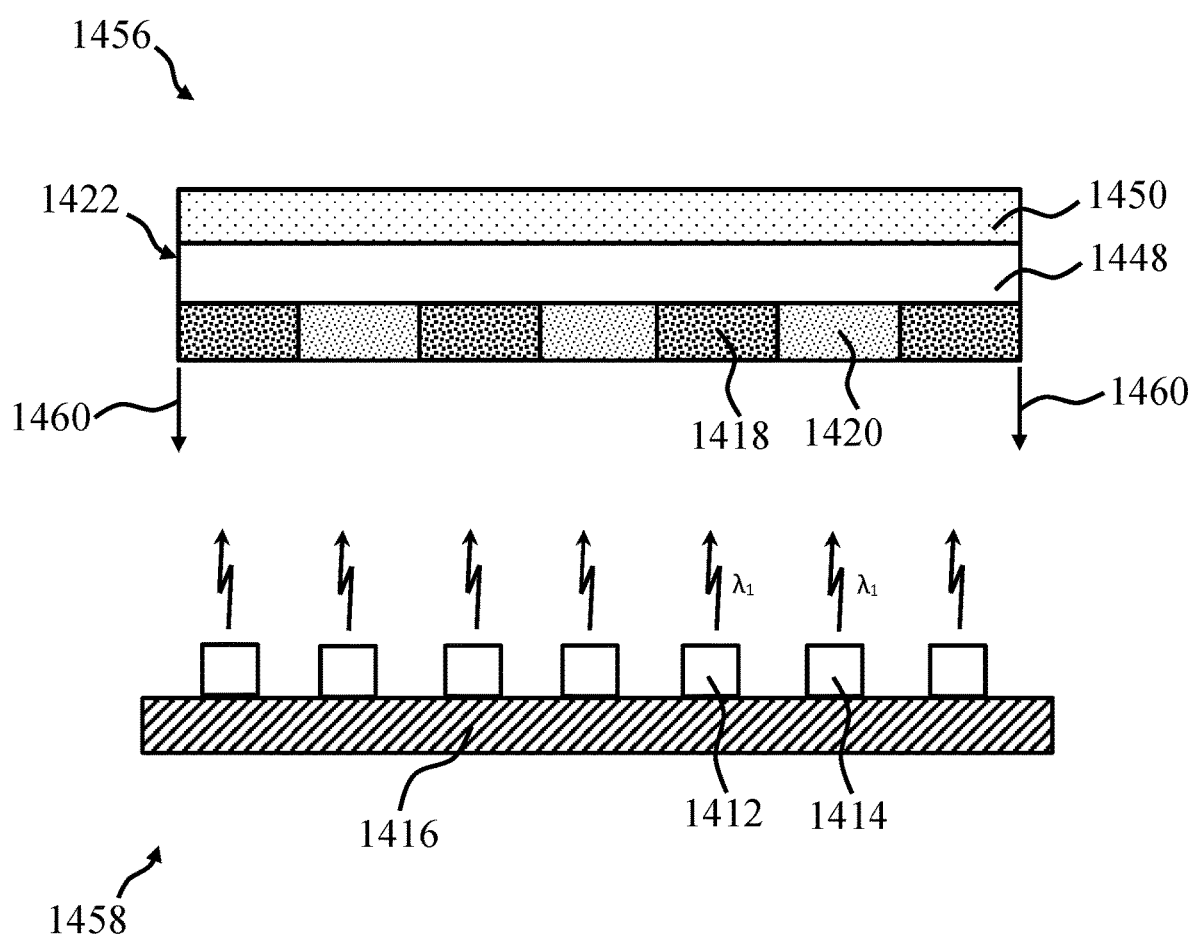
FIG. 14 is a sectional view of a component and a separate LED array for a white light emitting device in accordance with an embodiment of the invention.

Referring to FIG. 14, there is shown a component 1456 and a separate LED array 1458 for a white light emitting device in accordance with an embodiment of the invention. In this embodiment, the component 1456 comprises a diffusing layer 1422 disposed over alternating strips of first and second photoluminescence material layers 1418, 1420. The diffusing layer 1422 comprising a layer of light scattering particles 1450 and a layer of light transmissive material 1448. In this embodiment, the alternating strips of first and second photoluminescence material layers 1418,1420 are in direct contact with the layer of light transmissive material 1448 of the diffusing layer 1422, such that the layer of light transmissive material 1448 is disposed between the layer of light scattering particles 1450 and the alternating strips of first and second photoluminescence material layers 1418, 1420.

The first photoluminescence material layer 1418 comprises a first phosphor material excitable to generate white light having a correlated color temperature of 2700K, and the second photoluminescence material layer 1420 comprises a second phosphor material excitable to generate light having a correlated color temperature of 5000K.

There is also shown a separate LED array 1458 having an alternating array of first and second LEDs 1412,1414 disposed on a substrate 1416.

The component 1456 and LED array 1458 function in the manner described herein. The component 1456 may be assembled with the LED array 1458 in the direction indicated by arrows 1460 so that the alternating strips of the first and second photoluminescence material layers 1418, 1420 can be associated with the alternating arrays of first LEDs and second LEDs 1412, 1414.

It will be appreciated that the present invention is not restricted to the specific embodiments described and that variations can be made that are within the scope of the invention.

The invention claimed is:

1. A white light emitting device comprising a first LED and a second LED disposed on a substrate, wherein said first LED and said second LED emit blue light at substantially the same correlated color temperature, a first photoluminescence material layer disposed over at least said first LED, a second photoluminescence material layer disposed over at least said second LED, said second photoluminescence material layer separate from said first photoluminescence material layer, and a diffusing layer separate from and disposed over said first and second photoluminescence layers, said diffusing layer comprising light scattering particles.

2. The white light emitting device of claim 1, wherein said first photoluminescence material layer comprises a first phosphor material and said second photoluminescence material layer comprises a second phosphor material.

3. The white light emitting device of claim 2, wherein said first photoluminescence material layer is excitable by said blue light emitted by said first LED to generate white light having a correlated color temperature of 2700K to 3500K.

4. The white light emitting device of claim 2, wherein said second photoluminescence material layer is excitable by said blue light emitted by said first LED to generate white light having a correlated color temperature of 5000K to 6500K.

5. The white light emitting device of claim 1, comprising a plurality of first LEDs and a plurality of second LEDs, said plurality of first LEDs and said plurality of second LEDs arranged in alternating arrays.

6. The white light emitting device of claim 5, comprising alternating strips of said first and second said photoluminescence material layers associated with said alternating said arrays of said first LEDs and said second LEDs.

7. The white light emitting device of claim 1, wherein said diffusing layer comprises a light transmissive material and light scattering particles.

8. The white light emitting device of claim 7, wherein said light scattering particles are substantially uniformly distributed through said light transmissive material.

9. The white light emitting device of claim 7, wherein said diffusing layer comprises a layer of said light transmissive material and a layer of said light scattering particles.

10. The white light emitting device of claim 9, wherein said layer of said light transmissive material is disposed between said layer of said light scattering particles and said first and/or second photoluminescence material layers.

11. The white light emitting device of claim 9, wherein said layer of said light scattering particles is disposed between said layer of said light transmissive material and said first and/or second photoluminescence material layers.

12. The white light emitting device of claim 1, wherein at least one of said first photoluminescence material layer, said second photoluminescence material layer, and said diffusing layer comprises said light scattering particles.

13. The white light emitting device of claim 1, wherein said first LED and said second LED are directly disposed on said substrate, and wherein said substrate comprises a circuit board.

14. The white light emitting device of claim 13, wherein said circuit board is a metal core printed circuit board.

15. The white light emitting device of claim 1, wherein at least one of a thickness of the diffusing layer and a concentration of the light scattering particles varies along at least one of a length of said diffusing layer and a width of said diffusing layer.

16. The white light emitting device of claim 1, wherein the weight percent loading of the light scattering particles is from 0.1 to 50% wt or from 5 to 10% wt.

17. The white light emitting device of claim 1, further comprising a peripheral wall extending from the substrate, wherein the peripheral wall encloses at least the first LED and the second LED, wherein the first photoluminescence material layer, the second photoluminescence material layer, and the diffusing layer are contained within the peripheral wall.

18. The white light emitting device of claim 1, wherein at least one of said first photoluminescence material layer and said second photoluminescence material layer includes substantially no said light scattering particles.

19. A method of manufacturing a white light emitting device, comprising the steps of:
    providing an array of first LEDs;
    dispensing a first photoluminescence material layer into direct contact with at least said array of first LEDs;
    providing an array of second LEDs;
    dispensing a second photoluminescence material layer into direct contact with at least said array of second LEDs; and
    dispensing a separate diffusing layer into direct contact with said first and second photoluminescence material layers.

20. A white light emitting device comprising alternating arrays of first LEDs and second LEDs disposed on a substrate, a first photoluminescence material layer disposed over at least said array of first LEDs, a second photoluminescence material layer disposed over at least said array of second LEDs, and a single diffusing layer separate from and disposed over and in direct contact with both said first and second photoluminescence material layers, said diffusing layer comprising light scattering particles,
    wherein said first photoluminescence material layer comprises a first phosphor material excitable to generate white light having a first correlated color temperature, said second photoluminescence material layer comprises a second phosphor material excitable to generate white light having a second correlated color temperature.

21. The white light emitting device of claim 20, wherein the first correlated color temperature is from 2700K to 3500K and/or the second correlated color temperature is from 5000K to 6500K.

22. A component for a white light emitting device, comprising alternating strips of first and second photoluminescence material layers disposed on a substrate, and a single diffusing layer separate from and disposed over and in direct contact with said alternating strips of said first and second photoluminescence material layers, said diffusing layer comprising light scattering particles,
    wherein said first photoluminescence material layer comprises a first phosphor material excitable to generate white light having a first correlated color temperature, and said second photoluminescence material layer comprises a second phosphor material excitable to generate light having a second correlated color temperature.

23. The component of claim 22, wherein the first correlated color temperature is from 2700K to 3500K and/or the second correlated color temperature is from 5000K to 6500K.

* * * * *